United States Patent
Jung et al.

(10) Patent No.: US 11,201,626 B1
(45) Date of Patent: Dec. 14, 2021

(54) PHASE LOCKED LOOP DEVICE AND METHOD OF OPERATING IHE SAME

(71) Applicant: SAMSUNG ELECTRONICS CO., LTD., Suwon-si (KR)

(72) Inventors: Woochul Jung, Hwaseong-si (KR); Yongsun Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/240,570

(22) Filed: Apr. 26, 2021

(30) Foreign Application Priority Data

Sep. 21, 2020 (KR) .................. 10-2020-0121790

(51) Int. Cl.
*H03L 7/197* (2006.01)
*H03L 7/089* (2006.01)
*H03L 7/093* (2006.01)

(52) U.S. Cl.
CPC .......... *H03L 7/1976* (2013.01); *H03L 7/0891* (2013.01); *H03L 7/093* (2013.01)

(58) Field of Classification Search
CPC ...... H03L 7/1976; H03L 7/0891; H03L 7/093
See application file for complete search history.

(56) References Cited

U.S. PATENT DOCUMENTS

| | | | |
|---|---|---|---|
| 8,384,456 B1 | 2/2013 | Ramaswamy | |
| 9,231,605 B2 | 1/2016 | Ainspan et al. | |
| 9,246,500 B2 | 1/2016 | Perrott | |
| 9,490,818 B2 | 11/2016 | Perrott | |
| 9,762,250 B2 | 9/2017 | Perrott | |
| 10,218,449 B2 | 2/2019 | Lu et al. | |
| 10,425,086 B1* | 9/2019 | Chen | G01S 7/40 |
| 10,511,311 B1* | 12/2019 | Tertinek | H03L 7/10 |
| 10,895,850 B1* | 1/2021 | Elkholy | H03M 3/368 |
| 2007/0121710 A1* | 5/2007 | Chien | H03L 7/23 375/215 |
| 2011/0133797 A1 | 6/2011 | Sridharan | |
| 2012/0313676 A1* | 12/2012 | Nguyen | H03L 7/0991 327/156 |
| 2013/0187690 A1* | 7/2013 | Feng | H03L 7/0898 327/157 |
| 2014/0347105 A1* | 11/2014 | Rozenblit | H03L 7/102 327/156 |

(Continued)

FOREIGN PATENT DOCUMENTS

| | | |
|---|---|---|
| KR | 101278109 | 6/2013 |
| KR | 101851215 | 4/2018 |

*Primary Examiner* — Adam D Houston
(74) *Attorney, Agent, or Firm* — Volentine, Whitt & Francos, PLLC

(57) ABSTRACT

A phase locked loop device may include: a frequency modulating circuit configured to output a reference signal obtained by multiplying a frequency of an input signal by a predetermined ratio based on the input signal; a sigma-delta modulator configured to output division ratio information on one of a plurality of division rates at a number of times proportional to a frequency of the reference signal; and a phase locked loop (PLL) circuit configured to determine whether to activate based on a command signal, and, when activated, perform a phase-locking operation based on a fractional division based on the reference signal and the division ratio information.

20 Claims, 10 Drawing Sheets

(56) References Cited

U.S. PATENT DOCUMENTS

| | | | |
|---|---|---|---|
| 2015/0116018 A1* | 4/2015 | Chen | H03L 7/0991 |
| | | | 327/159 |
| 2015/0326236 A1* | 11/2015 | Thiagarajan | H03L 7/0812 |
| | | | 375/221 |
| 2017/0180170 A1* | 6/2017 | Purushothaman | H03D 3/242 |
| 2017/0244544 A1* | 8/2017 | Galton | H03L 7/093 |
| 2017/0366376 A1* | 12/2017 | Wang | H03L 7/1976 |
| 2018/0145696 A1* | 5/2018 | Sarda | H03L 7/0802 |
| 2019/0074842 A1* | 3/2019 | Sun | H03L 7/197 |
| 2019/0212703 A1* | 7/2019 | Yao | H03L 7/0891 |
| 2019/0334533 A1* | 10/2019 | Nassar | H03L 7/091 |
| 2020/0076440 A1* | 3/2020 | Ng | H03L 7/081 |
| 2020/0136628 A1* | 4/2020 | van den Heuvel | H03C 3/0991 |
| 2020/0162084 A1* | 5/2020 | Darabi | H03B 5/32 |
| 2020/0177194 A1* | 6/2020 | Aouini | H03L 7/1976 |
| 2020/0373927 A1* | 11/2020 | Liang | H03L 7/18 |
| 2021/0013888 A1* | 1/2021 | Kim | H03L 7/093 |
| 2021/0021402 A1* | 1/2021 | Sridharan | H03L 7/1976 |
| 2021/0194430 A1* | 6/2021 | van den Heuvel | H03L 7/093 |
| 2021/0194489 A1* | 6/2021 | Shi | H03K 5/01 |
| 2021/0218406 A1* | 7/2021 | Buckel | H03L 7/0812 |
| 2021/0234547 A1* | 7/2021 | van den Heuvel | H03C 3/0966 |

* cited by examiner ental idea of the disclosure relates to a phase locked loop, and more particularly, to a phase locked loop device and a method of operating the phase locked loop device.

PHASE LOCKED LOOP DEVICE AND METHOD OF OPERATING IHE SAME

CROSS-REFERENCE TO RELATED APPLICATION

This application is based on and claims priority under 35 U.S.C. § 119 to Korean Patent Application No. 10-2020-0121790, filed on Sep. 21, 2020, in the Korean Intellectual Property Office, the disclosure of which is incorporated by reference herein in its entirety.

BACKGROUND

The technical idea of the disclosure relates to a phase locked loop, and more particularly, to a phase locked loop device and a method of operating the phase locked loop device.

A phase locked loop (PLL) circuit or a clock generator having the PLL circuit may generate a phase locked clock signal. For example, the clock signal may be used to transmit data at a transmitter or to recover data at a receiver. In this case, the PLL circuit may be divided into a ring-PLL circuit, an inductor-capacitor (LC)-PLL circuit, and the like.

Recently, in order to improve the noise characteristics of the PLL circuit, a technique of locking the phase of the clock signal through sub-sampling has been applied to the PLL circuit. During the sub-sampling operation, the frequency divider does not divide the clock signal, and thus, there is a limitation in performing the fractional division operation. In order to solve this limitation, a technology that enables fractional division using a digital to time converter during a sub-sampling operation was introduced. However, there is a problem that the performance of the clock generator is deteriorated due to the limited resolution and quantization noise.

SUMMARY

A problem to be solved by the technical idea of the disclosure is to provide an efficient phase locked loop device with improved quantization noise.

In order to solve the above problem, a phase locked loop device according to an embodiment of the disclosure may include a frequency modulating circuit configured to output a reference signal obtained by multiplying a frequency of an input signal by a predetermined ratio based on the input signal; a sigma-delta modulator configured to output division ratio information on one of a plurality of division rates at a number of times proportional to the frequency of the reference signal; and a phase locked loop (PLL) circuit configured to determine whether to activate based on a command signal, and, when activated, perform a phase-locking operation based on a fractional division based on the reference signal and the division ratio information.

In addition, a method of operating a phase locked loop device according to the disclosure may include generating a reference signal obtained by multiplying the frequency of an input signal by a predetermined ratio based on the input signal; outputting division ratio information on one of a plurality of division rates at a number of times proportional to the frequency of the reference signal; receiving a command signal associated with whether to perform a phase-locking operation; and performing a phase-locking operation based on a fractional division based on the reference signal and the division ratio information in the case that the command signal instructs to perform a phase-locking operation.

In addition, the phase locked loop system may include a controller configured to generate a command signal indicating whether to perform a phase lock operation based on an operation mode; and a phase locked loop device configured to generate a reference signal obtained by multiplying the frequency of an input signal by a predetermined ratio based on the input signal, generate division ratio information on one of a plurality of division ratios at a number of times proportional to the frequency of the reference signal, receive the command signal, and perform a phase-locking operation based on a fractional division based on the reference signal and the division ratio information in the case that the command signal instructs to perform the phase-locking operation.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Hereinafter, exemplary embodiments of the disclosure will be described in detail with reference to the accompanying drawings.

Figure 1:
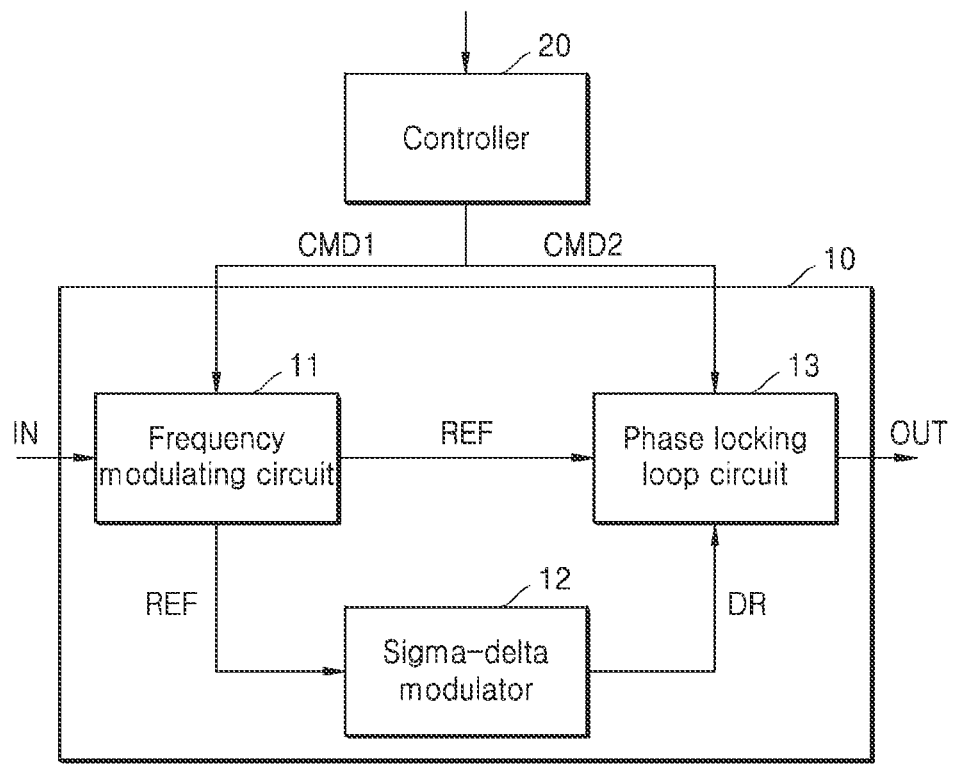
FIG. 1 is a diagram illustrating a configuration of a phase locked loop system including a phase locked loop device and a controller according to an embodiment.

FIG. 1 is a diagram showing the configuration of a phase locked loop system including a phase locked loop device 10 and a controller 20 according to an embodiment of the disclosure.

Referring to FIG. 1, the phase locked loop system may include the phase locked loop device 10 and the controller 20, and the phase locked loop device 10 may generate an output signal OUT using an input signal IN based on a command of the controller 20. The phase locked loop device 10 may include a frequency modulating circuit 11, a sigma-delta modulator 12, and a phase locked loop circuit 13.

The phase locked loop device 10 according to an embodiment may receive the input signal IN and generate a reference signal REF in the frequency modulating circuit 11 based on the input signal IN. The frequency modulating circuit 11 may provide the generated reference signal REF to the phase locked loop circuit 13 and the sigma-delta modulator 12. The sigma-delta modulator 12 may generate division ratio information DR based on the clock period of the reference signal REF, and the phase locked loop circuit 13 may generate the output signal OUT.

The frequency modulating circuit 11 may generate the reference signal REF based on a frequency of the input signal IN and generate the reference signal REF obtained by multiplying the frequency of the input signal IN by a predetermined ratio, for example. The frequency modulating circuit 11 may output a signal having a high frequency noise blocking bandwidth as the reference signal REF. The frequency modulating circuit 11 may be, for example, a multiplying delay locking loop (MDLL) or an injection phase locked loop (PLL), and because a jitter component is not accumulated, the ratio of random noise RJ of the internal oscillator may be greatly reduced. Accordingly, the frequency modulating circuit 11 may output the reference signal REF with little noise even when receiving the input signal IN including noise, and the reference signal REF may have a high frequency noise blocking bandwidth.

The sigma-delta modulator 12 may receive the reference signal REF from the frequency modulating circuit 11 and output division ratio information DR in proportion to the frequency of the reference signal REF. The division ratio information DR may be a frequency ratio of the reference signal REF input to the phase locked loop circuit 13 and the output signal OUT and may be information for determining how much to divide the frequency of the output signal OUT. The sigma-delta modulator 12 may provide one of a plurality of integer division ratios to the phase locked loop circuit 13, whenever the phase locked loop circuit 13 is toggled from a certain logic state to another logic state, so that the phase locked loop circuit 13 may perform a phase-locking operation based on a fractional division.

The phase locked loop circuit 13 receiving the division ratio information DR and the reference signal REF may perform a phase fixing operation based on the fractional division using the division ratio information DR and the reference signal REF. The phase locked loop circuit 13 may generate a signal, which is multiplied by a division ratio compared to the frequency of the reference signal REF, as the output signal OUT. In detail, a voltage controlled oscillator (VCO) of the phase locked loop circuit 13 may output an oscillation signal multiplied by a division ratio with respect to the frequency of reference signal REF, and a divider of the phase locked loop circuit 13 may generate a feedback signal obtained by dividing the frequency of the oscillation signal by the division ratio. That is, the frequency of the feedback signal may be the same as the frequency of the reference signal REF and a phase frequency detector of the phase locked loop circuit 13 may lock the phase of the oscillation signal by comparing the feedback signal to the reference signal REF.

The phase locked loop device 10 according to an embodiment may receive a plurality of command signals from the controller 20. Referring to FIG. 1, the frequency modulating circuit 11 may receive a first command signal CMD1 and the phase locked loop circuit 13 may receive a second command signal CMD2. The frequency modulating circuit 11 may be activated based on the first command signal CMD1, and the phase locked loop circuit 13 may be activated based on the second command signal CMD2. FIG. 1 shows that each of the frequency modulating circuit 11 and the phase locked loop circuit 13 independently receives the command signal, but in the injection locking oscillator circuit of the disclosure, only one of the frequency modulating circuit 11 and the phase locked loop circuit 13 may receive the command signal.

The command signal may be composed of a series of bits, and a command type may be determined based on a combination of bits. As examples, the command types may include active, idle, pre-active, UFS-sleep, pre-sleep, UFS-PowerDown, and pre-PowerDown modes. The command types are listed as examples, and an embodiment of the disclosure may include all commands capable of turning the power of the phase locked loop circuit 13 on and off.

When the phase locked loop circuit 13 receives the command signal in the active mode, the phase locked loop circuit 13 may perform an operation in response to receiving a control signal related to the operation of the phase locked loop circuit or may perform each operation in a background mode. While each of phase locked loop circuits 13 is performing respective operations based on the command signal in the active mode, the phase locked loop circuit 13 may not perform all operations in response to receiving the command signal in the idle mode. The phase locked loop circuit 13 may transition to the active mode in response to receiving an arbitrary command signal when operating in the idle mode.

The pre-active mode may be a transitional mode associated with the active mode. When the phase locked loop circuit 13 operates in the pre-active mode, less power may be consumed compared to when the phase locked loop circuit 13 operates in the active mode. Receiving the command signal related to the pre-active mode, the phase locked loop circuit 13 may stand by to operate in the active mode by continuing the pre-active mode until all signals related to the active mode are received.

The UFS-sleep mode may be a mode in which power supply to the phase locked loop circuit 13 is cut off in order to reduce power consumption of the phase locked loop circuit 13. The pre-sleep mode may be a transient mode associated with the UFS-sleep mode. When the phase locked loop circuit 13 operates in the pre-sleep mode, the phase locked loop circuit 13 may consume less power than in the active mode, and may operate in the UFS-sleep mode in response to receiving a preset control signal.

UFS-PowerDown mode is a mode that maximizes power savings. In the UFS-PowerDown mode, all volatile data is lost, and all power supplies including VCC may be removed. The phase locked loop circuit 13 may enter the UFS-PowerDown mode in response to receiving a signal related to the power mode transition from the pre-power down mode. The pre-power down mode may be a transient mode associated with the power down mode. When the phase locked loop circuit 13 operates in the pre-power down mode, the phase locked loop circuit 13 may consume less power than when operating in the active mode, and may operate in the UFS-PowerDown mode in response to receiving a preset control signal.

Figure 2A:
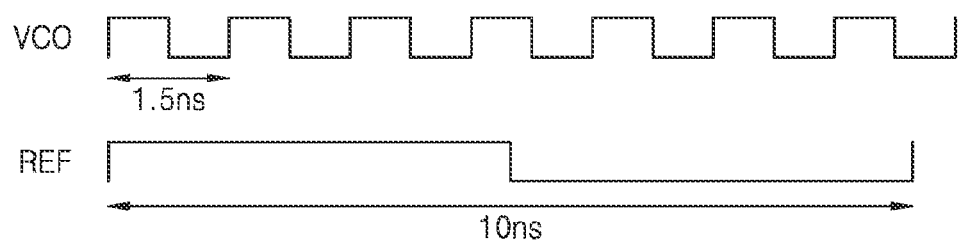
FIG. 2A is a graph showing the logic of a clock signal and a reference signal of a voltage controlled oscillator according to an embodiment.
Figure 2B:
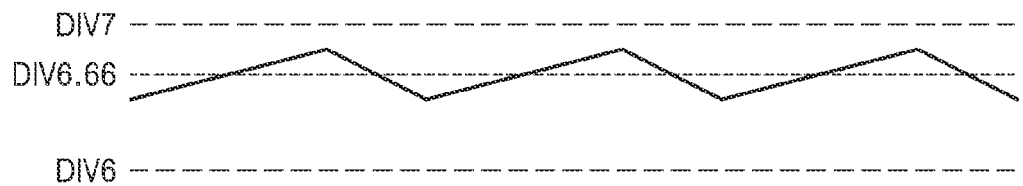
FIG. 2B is a graph showing an example of generating a fractional division ratio for performing a phase-locking operation based on a fractional division.

FIG. 2A is a graph showing the logic of a clock signal and a reference signal REF of the voltage controlled oscillator VCO according to an embodiment, and FIG. 2B is a graph showing an example of generating a fractional division ratio for performing a phase-locking operation based on a fractional division.

Referring to FIG. 2A, a period of a clock signal generated by a voltage controlled oscillator VCO and a period of a reference signal REF may be formed at a fractional ratio. According to the embodiment of FIG. 2A, the period of the clock signal generated by the voltage controlled oscillator VCO is 1.5 ns, the period of the reference signal REF is 10 ns, and the period ratio of the clock signal to the reference signal REF is 20/3. The phase locked loop circuit 13 may perform a phase-locking operation by dividing the clock signal generated by the voltage controlled oscillator VCO and comparing the divided clock signal with the reference signal REF. However, the divider of the phase locked loop circuit 13 is capable of dividing the clock signal only by an integer multiple, and is not capable of dividing by a fractional multiple.

Accordingly, referring to FIG. 2B, the phase locked loop circuit 13 may divide the clock signal at a ratio close to the target fractional division ratio by dividing the clock signal at a plurality of division ratios. For example, a target fractional division ratio for comparing a clock signal having a period of 1.5 ns with a reference signal REF having a period of 10 ns may be 6.66, and the phase locked loop circuit 13 may divide the clock signal at a rate approaching 6.66 based on the integer division ratio of 6 and 7. The phase locked loop circuit 13 may divide the clock signal at a ratio close to the target fractional division ratio by dividing by 6 once and by 7 twice in order to divide the clock signal at a rate approaching 6.66.

As shown in FIGS. 2A and 2B, when the frequency division ratio is set to a variable value and the clock signal is divided into a plurality of division ratios to have a target fractional division ratio, the phase locked loop circuit 13 may divide the clock signal with the target fractional division ratio on average, but does not divide the clock signal with an accurate target fractional division ratio every moment, and thus, quantization noise may occur. The quantization noise may appear as a fractional spur in the output signal of the phase locked loop circuit 13, and a phase-locking operation based on a fractional division may cause deterministic jitter (DJ).

Figure 3:
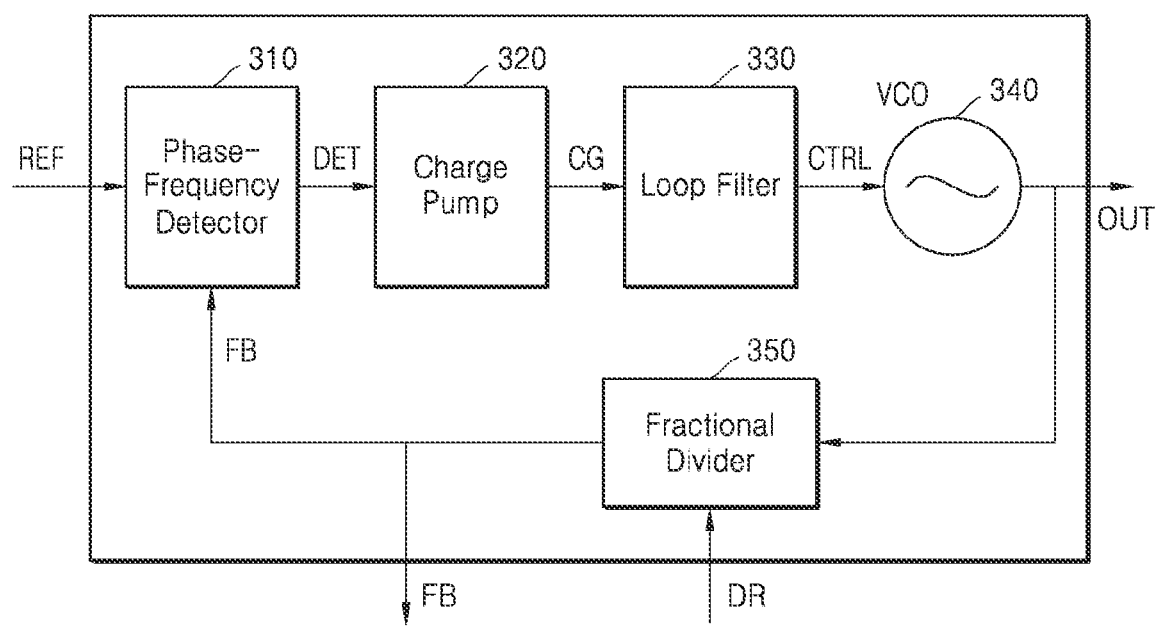
FIG. 3 is a diagram illustrating a phase locked loop circuit according to an embodiment.

FIG. 3 is a diagram showing a phase locked loop circuit 13 according to an embodiment.

Referring to FIG. 3, the phase locked loop circuit 13 may include a phase-frequency detector (PFD) 310, a charge pump 320, and a loop filter 330, a voltage control oscillator 340, and a fractional divider 350. The phase-locked loop circuit 13 may compare the feedback signal FB generated based on the oscillation signal generated by the voltage control oscillator 340 with the reference signal REF and lock the phase of the oscillation signal to generate an oscillation signal having a target frequency targeted by the voltage control oscillator 340.

The voltage-controlled oscillator 340 is an oscillator that generates a target high-frequency oscillation signal to be output, but the frequency of the oscillation signal may be greatly affected by surrounding conditions. For example, the frequency of the oscillation signal is slightly shaken due to the influence of internal circuits, peripheral equipment, temperature, and weather (e.g., environmental conditions), so that the voltage control oscillator 340 may output a frequency at which an error occurs with respect to the target frequency. In particular, the higher the frequency of the output signal, the greater error may occur in the output signal due to noise components.

The fractional divider 350 may generate a feedback signal FB by receiving the output signal and the division ratio information DR. The fractional divider 350 may generate a signal, obtained by dividing the frequency of the output signal by the received division ratio, which is a feedback signal FB; and the fractional divider 350 may divide the output signal by an integer divider ratio. The fractional divider 350 may receive a divider ratio that is varied by the sigma-delta modulator 12. As the fractional divider 350 receives the variable integer division ratio, an average division ratio divided by the fractional divider 350 may be close to the target fractional division ratio.

The fractional divider 350 may include a counter as an example, and the counter may generate a feedback signal FB in which a logic state is transitioned based on the division ratio information DR. In detail, the counter may count the number of rising clocks of the output signal and may transition the logic state of the feedback signal FB in response to a rising clock signal corresponding to an integer division ratio being input. For example, when the integer division ratio is 6, the fractional divider 350 may transition the logic state of the feedback signal FB once in response to the case where the rising clock of the output signal is input 6 times.

The fractional divider 350 may generate a feedback signal FB and provide the feedback signal FB to the phase frequency detector 310 and the sigma-delta modulator 12. The phase frequency detector 310 may transmit a detection signal DET to the charge pump 320 based on the reference signal REF received from the frequency modulating circuit 11 and the feedback signal FB. The phase frequency detector 310 may include a comparator, and the comparator may generate the detection signal DET indicating a phase difference between the reference signal REF and the feedback signal FB based on the difference between the reference signal REF and the feedback signal FB. In detail, when there is no difference between the reference signal REF and the feedback signal FB, the phase frequency detector 310 may generate a detection signal DET with a value of 0. When there is a difference between the reference signal REF and the feedback signal FB, the phase frequency detector 310 may generate the detection signal DET having a pulse width corresponding to a section in which the difference exists. The phase frequency detector 310 may output the detection signal DET having a pulse magnitude that is constant, but having a pulse width that is changed according to a difference between the feedback signal FB and the phase detection signal DET and having a sign that is determined depending on which of the two signals has a higher level.

The charge pump 320 and loop filter 330 may receive the detection signal DET from the phase frequency detector 310 and generate a control voltage CTRL based on the detection signal DET. The charge pump 320 and loop filter 330 may determine a sign of the control voltage CTRL based on the sign of the detection signal DET, and may determine the magnitude of the control voltage CTRL based on the pulse width of the detection signal DET.

For example, the charge pump 320 may provide a charge CG to the loop filter 330 in response to a positive pulse of the detection signal DET being input, and may determine the amount of charge to be provided based on the pulse width of the detection signal DET. Conversely, the charge pump 320 may discharge the charge CG of the loop pump in response to a negative pulse of the detection signal DET being input and may determine the amount of charge discharged based on the pulse width of the detection signal DET.

The loop filter 330 may include a capacitor, and the capacitor may store the charge CG provided from the charge pump 320 or the charge CG stored in the capacitor may be discharged by the charge pump 320. The loop filter 330 may provide a control voltage CTRL that is variable based on the amount of charge stored in the capacitor to the voltage controlled oscillator 340. In addition, the loop filter 330 includes a low pass filter for providing the control voltage CTRL of a DC component to the voltage controlled oscillator 340, and the low pass filter may remove unnecessary noise components excluding the control voltage CTRL.

The voltage controlled oscillator 340 may receive the control voltage CTRL and adjust the frequency of the oscillation signal output based on the control voltage CTRL. For example, when the voltage controlled oscillator 340 is applied with the positive control voltage CTRL, the voltage controlled oscillator 340 may output an oscillation signal with a target frequency by outputting a frequency higher than the frequency of the current oscillation signal.

In addition, the phase-locked loop circuit 13 of the disclosure may adjust the frequency of the oscillation signal of the voltage controlled oscillator 340 without changing the reference signal REF input from the frequency modulating circuit 11 by adjusting the division ratio information DR of the fractional divider 350. In detail, when the division ratio is increased by the host device or the controller 20, the phase locked loop circuit 13 may adjust the frequency of the oscillation signal of the voltage controlled oscillator 340 to minimize the difference between the reference signal REF and the feedback signal FB, and may adjust the frequency of the oscillation signal until a difference between the feedback signal FB obtained by dividing the frequency of the oscillation signal by the division ratio and the reference signal REF is minimized.

Figure 4:
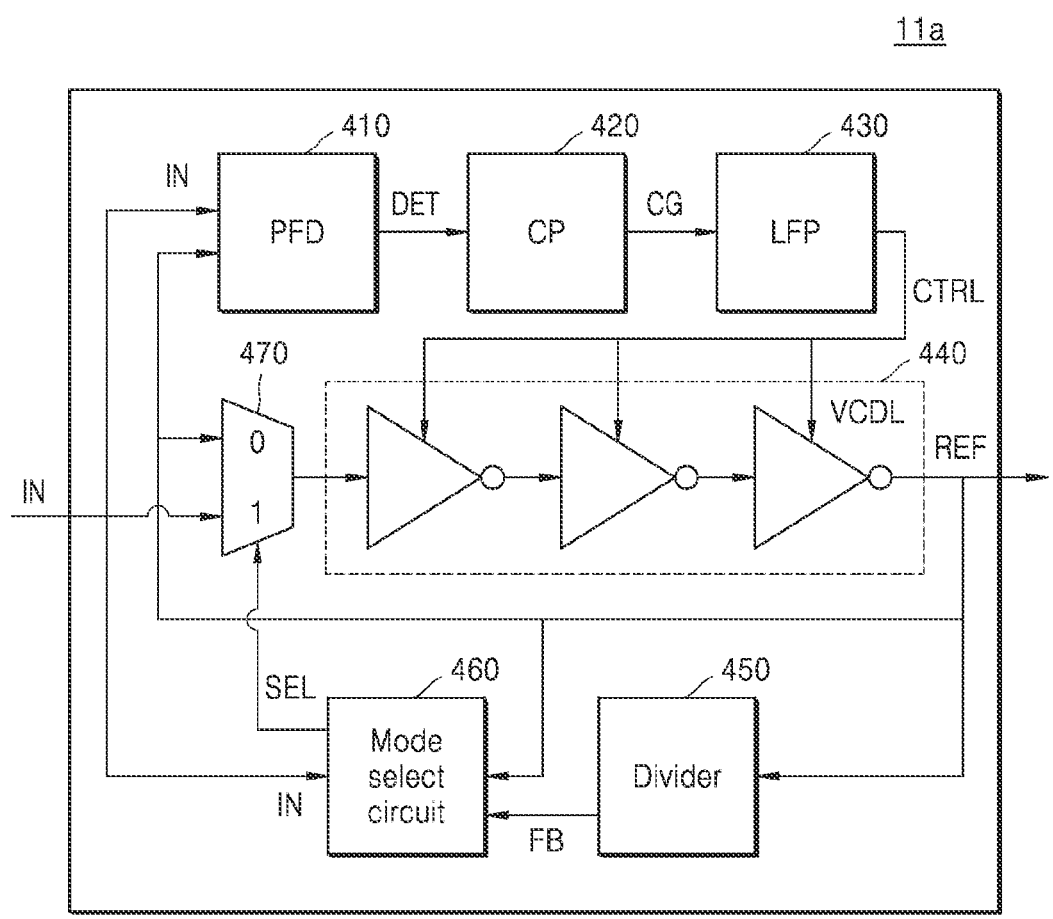
FIG. 4 is a diagram showing a frequency modulating circuit according to an embodiment.
Figure 5:
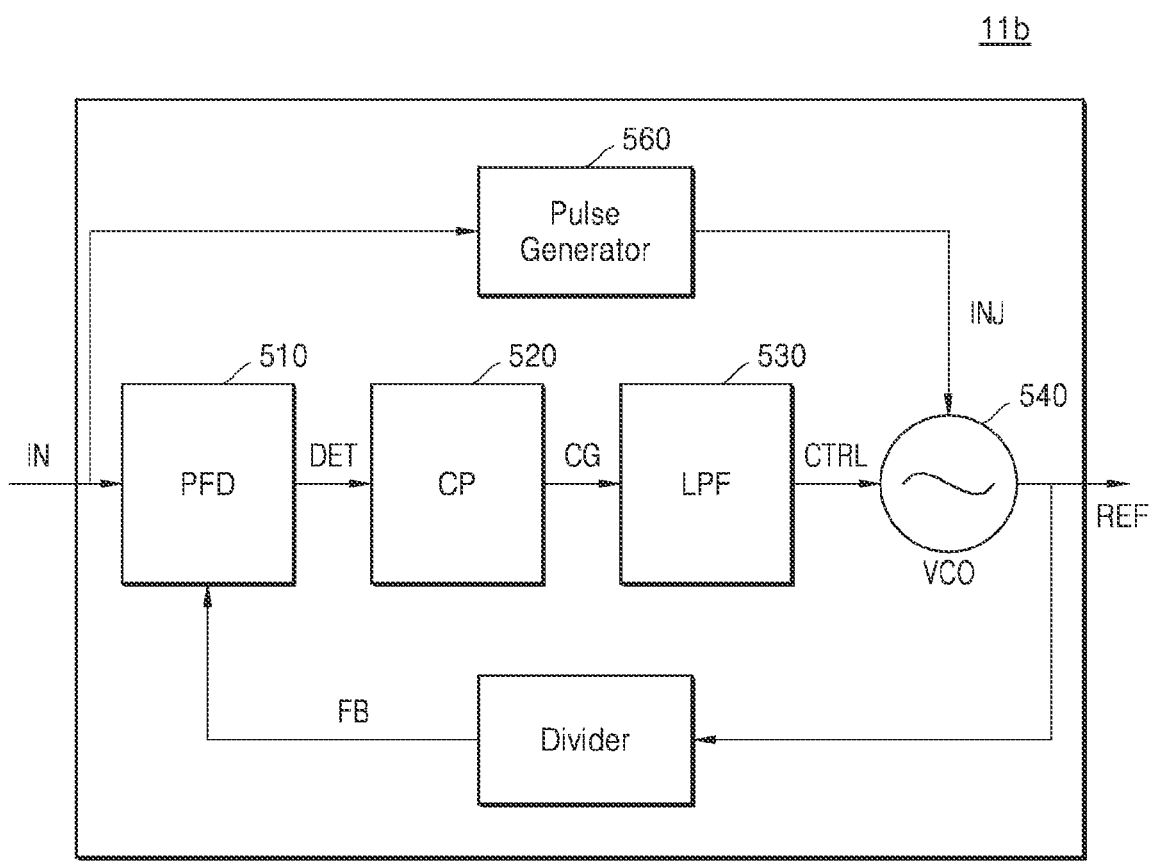
FIG. 5 is a diagram showing a frequency modulating circuit according to another embodiment.

FIG. 4 is a diagram showing a frequency modulating circuit 11*a* according to an embodiment, and FIG. 5 is a diagram showing a frequency modulating circuit 11*b* according to another embodiment.

Referring to FIG. 4, the frequency modulating circuit 11*a* may adjust the frequency of the reference signal REF by adjusting the delay time required by a control voltage CTRL applied to the voltage-controlled delay line (VCDL) 440. The frequency modulating circuit 11*a* according to FIG. 4 may be a multiplying delay locking loop (MDLL), and the frequency modulating circuit 11*a* may include a phase frequency detector 410, a charge pump 420, a loop filter 430, a multiplexer 470, the voltage controlled delay line 440, a mode selection circuit 460, and a divider 450. The mode selection circuit 460 may generate a mode selection signal SEL that controls the multiplexer 470 based on an input signal IN, a feedback signal FB generated from the divider 450, and a reference signal REF.

The divider 450 may generate the feedback signal FB with a low frequency based on the reference signal REF with a high frequency. The divider 450 may include a counter, and the counter may count the number of times the rising edge of the reference signal REF is input and may transition the logic state of the feedback signal FB in response to a rising edge corresponding to the division ratio being input.

The mode selection circuit 460 may receive the feedback signal FB, the input signal IN, and the reference signal REF and output a mode selection signal SEL. The mode selection circuit 460 may determine whether all of the feedback signal FB, the input signal IN, and the reference signal REF satisfy a predetermined logic state condition and may determine a logic state of the mode selection signal SEL based on the determination. For example, when the feedback signal FB and the reference signal REF are logic low, the mode selection signal SEL is output logic high, and when the input signal IN and the reference signal REF are logic high, the mode selection signal SEL may be output logic low.

The multiplexer 470 may determine a signal to be applied to the voltage control delay line 440 based on the logic state of the mode selection signal SEL. The voltage controlled delay line 440 may perform an operation of the oscillator or a delay operation of the oscillator according to a signal applied to the voltage controlled delay line 440. The voltage control delay line 440 may perform the operation of the oscillator operation by outputting the reference signal REF in response to the multiplexer 470 receiving the mode selection signal SEL having logic low, and the voltage control delay line 440 may perform a delay operation of the oscillator by outputting the input signal IN in response to the multiplexer 470 receiving the mode selection signal SEL having logic high.

The phase frequency detector 410 may generate a detection signal DET indicating a phase difference between the input signal IN and the reference signal REF based on a difference between the input signal IN and the reference signal REF. The charge pump 420 may provide charge to the loop filter 430 or discharge the charge of the loop filter 430 based on the detection signal DET, and the loop filter 430 may provide the control voltage CTRL to the voltage control delay line 440 based on the stored charge amount.

Referring to FIG. 5, according to an embodiment different from that of FIG. 4, a frequency modulating circuit 11*b* may output a reference signal REF in which a frequency is multiplied by a division ratio from an input signal IN. The frequency modulating circuit 11*b* according to FIG. 5 may be implemented as an injection-locked PLL circuit, and include a pulse generator 560 that outputs an injection signal INJ based on the input signal IN. The injection-locked PLL circuit is an embodiment in which the pulse generator 560 is added to the phase locked loop circuit 13 and a phase frequency detector 510 of the frequency modulating circuit 11*b* may generate a control voltage CTRL to be applied to the voltage controlled oscillator 540 by a charge pump 520 and a loop filter 530 by comparing the logic levels of a feedback signal FB to the input signal IN.

The pulse generator 560 may generate the injection signal INJ of a pulse signal corresponding to the period of the input signal IN, and the voltage controlled oscillator 540 may fix a phase of the reference signal REF having a frequency in which the frequency of the input signal IN is multiplied by an integer division ratio by receiving the injection signal INJ. In detail, the pulse generator 560 may generate the injection signal INJ in response to a rising edge of the input signal IN, and the injection signal INJ is applied to the voltage controlled oscillator 540 so that the voltage controlled oscillator 540 may periodically lock the phase of the reference signal REF.

When the frequency modulating circuit 11*b* generates the reference signal REF based only on the phase locked loop circuit 13, noise may occur near the target frequency of the reference signal REF, thereby generating an unstable reference signal REF. On the other hand, the frequency modulating circuit 11*b* according to an embodiment of FIG. 5 may remove noise near the target frequency of the reference signal REF by applying the injection signal INJ to the voltage controlled oscillator 540 every period corresponding to the input signal IN, thereby generating a stable reference signal REF.

That is, the embodiments according to FIGS. 4 and 5 are a frequency modulating circuit 11 that generates a reference signal REF having a frequency in which the frequency of the input signal IN is multiplied by a division ratio, and because jitter components are not accumulated in the circuit, the stable reference signal REF may be generated. In detail, the voltage controlled oscillator may generate random noise RJ even when the control voltage CTRL is applied, but the embodiment according to FIG. 4 may generate a reference signal REF through a voltage controlled delay line and the embodiment according to FIG. 5 may significantly reduce a random noise generation rate by locking the phase of the voltage controlled oscillator by the injection signal INJ.

Accordingly, the phase locked loop circuit 13 and the sigma-delta modulator 12 of the disclosure may perform a phase-locking operation based on a fractional division by receiving the reference signal REF from which noise around the target frequency has been removed.

Figure 6A:
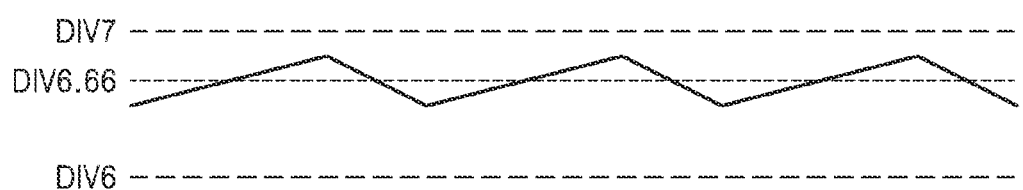
FIG. 6A is a graph showing division ratio information according to a comparative embodiment.
Figure 6B:
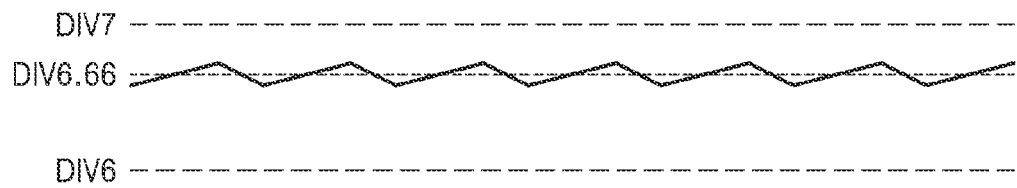
FIG. 6B is a graph showing division ratio information output based on a reference signal according to FIG. 4 or 5.

FIG. 6A is a graph showing division ratio information according to a comparative embodiment, and FIG. 6B is a graph showing division ratio information output based on a reference signal according to FIG. 4 or 5.

According to the comparative embodiment, in order to perform a stable phase lock operation, the phase locked loop circuit 13 may receive a low frequency clock signal generated by a low frequency oscillator with low noise. Based on the low frequency clock signal, the sigma-delta modulator 12 may provide the division ratio information to the phase locked loop circuit 13. For example, whenever a rising edge or a falling edge occurs in the clock signal, one of a plurality of pieces of division ratio information may be provided to the phase locked loop circuit 13. Because the sigma-delta modulator 12 generates division ratio information based on the low frequency clock signal, when the phase locked loop circuit 13 performs a phase-locking operation based on a fractional division, a difference between the average division ratio generated by the plurality of division ratios and a target division ratio may be large. That is, when the phase locked loop circuit 13 performs a phase-locking operation based on a fractional division based on the low frequency clock signal, the fractional spur may be large.

In contrast, the frequency modulating circuit 11 of the disclosure may output a high frequency reference signal generated based on the input signal to the phase locked loop circuit 13 and the sigma-delta modulator 12. In addition, because the frequency modulating circuit 11 may generate a high frequency reference signal based on the MDLL circuit or the injection-locked phase locked loop circuit 13, a stable high frequency reference signal from which noise is removed near the target frequency may be generated.

Referring to FIG. 6B, a stable high-frequency reference signal may be applied to the sigma-delta modulator 12, and for example, whenever a rising edge or a falling edge occurs in the reference signal, one of the plurality of pieces of division ratio information may be provided to the phase locked loop circuit 13. Therefore, the sigma-delta modulator 12 may compare the average division ratio to the target division ratio more times than in the comparative embodiment. Therefore, the difference between the generated average division ratio and the target division ratio may be small compared to the comparative embodiment. That is, when the phase locked loop circuit 13 performs a phase-locking operation based on a fractional division based on a stable high frequency clock signal, the fractional spur may be smaller than that of the comparative embodiment.

Figure 7:
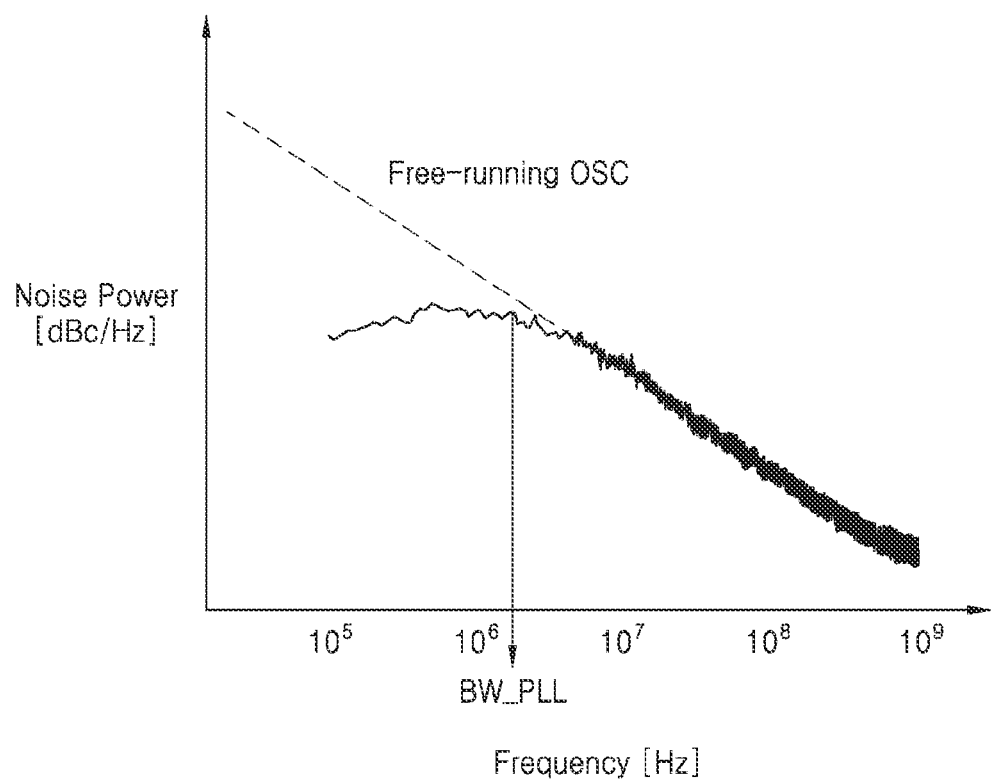
FIG. 7 is a graph showing noise power of a reference signal output according to a comparative embodiment.
Figure 8:
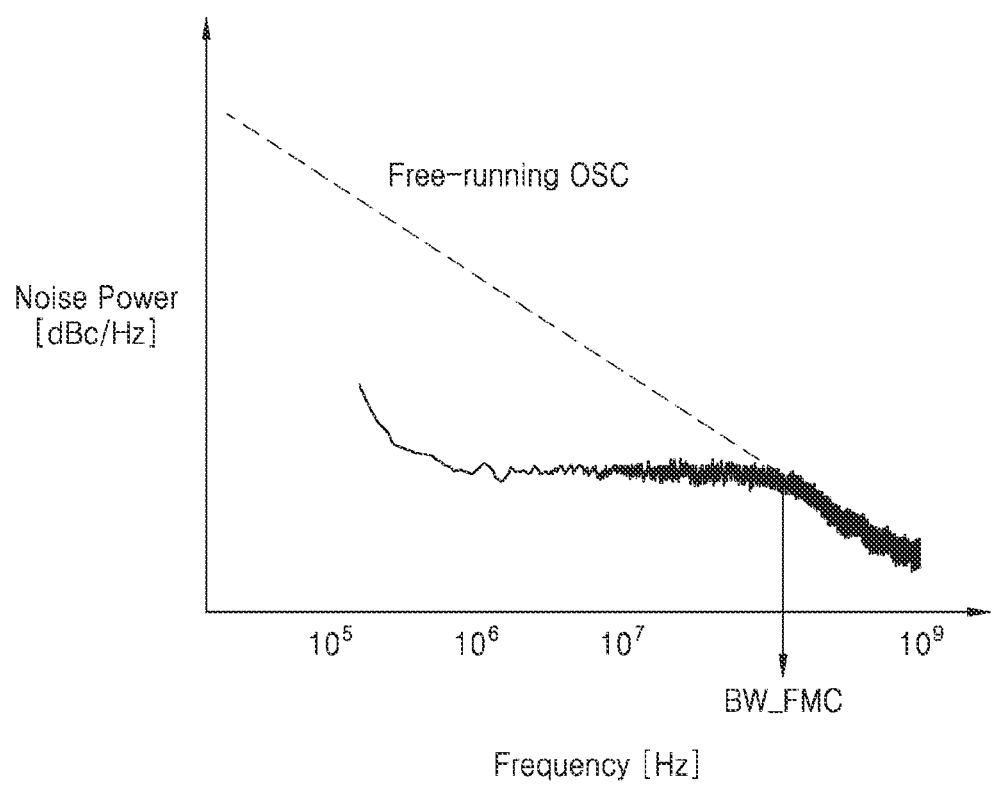
FIG. 8 is a graph showing noise power of a reference signal output according to an embodiment of the disclosure.

FIG. 7 is a graph showing noise power of a reference signal output according to a comparative embodiment, and FIG. 8 is a graph showing noise power of a reference signal output according to an embodiment of the disclosure.

Referring to FIG. 7, the phase locked loop circuit 13 and the frequency modulating circuit 11 according to the comparative embodiment may output an oscillation signal from which noise is removed up to a certain frequency range. For example, the phase locked loop may output an oscillation signal from which noise up to 2 MHz has been removed.

Referring to FIG. 8, the frequency modulating circuit 11 according to the exemplary embodiment of the disclosure may generate a reference signal from which noise of a higher frequency range is removed compared to the comparative embodiment of FIG. 7. For example, the frequency modulating circuit 11 may generate a reference signal from which noise of about 100 MHz has been removed.

That is, the frequency modulating circuit 11 according to the embodiment of the disclosure may have a higher cutoff bandwidth BW_FMC than the cutoff bandwidth BW_PLL of the comparative embodiment, and accordingly, a stable reference signal may be generated by removing more noise components from the reference signal.

Figure 9:
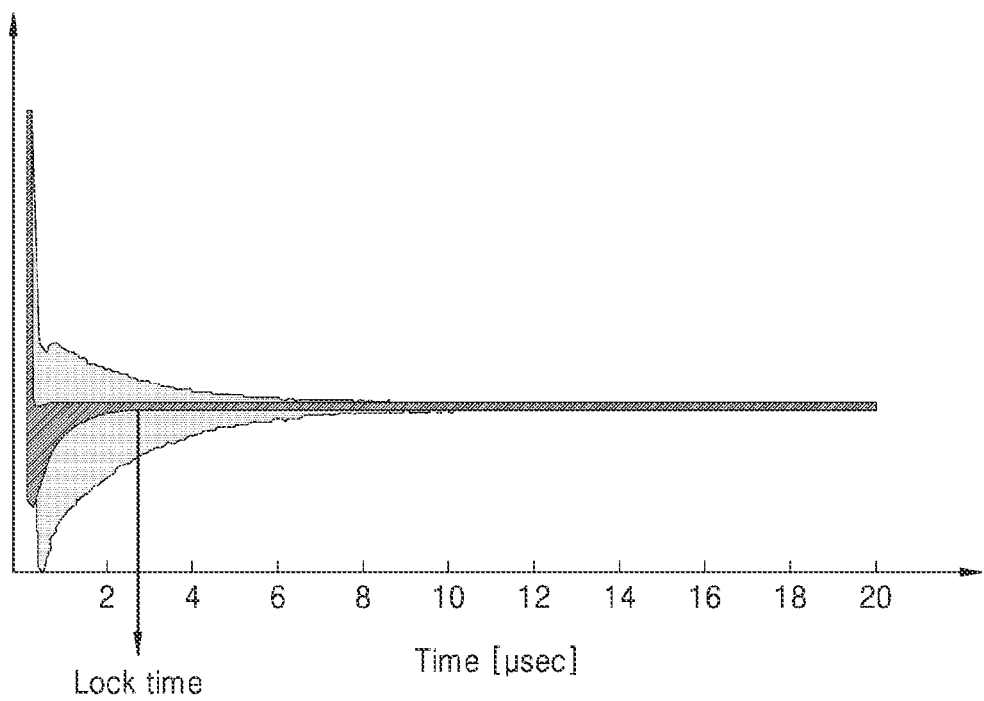
FIG. 9 is a comparison graph showing a lock time of a phase locked loop circuit according to an embodiment.

FIG. 9 is a comparison graph showing a lock time of the phase locked loop circuit 13 according to an embodiment.

Referring to FIG. 9, the phase locked loop circuit 13 performs a phase-locking operation based on a fractional division based on a reference signal having a higher frequency than that of the comparative embodiment, and accordingly, the phase may be locked faster than that of the comparative embodiment. Referring to the embodiment of FIG. 9, the phase locked loop circuit 13 of the comparative embodiment may lock the phase after 10 μs because the phase-locking operation has been performed; but according to the embodiment of the disclosure, the phase may be locked around 2 μs. That is, as an off-state oscillator is activated, the lock time for generating a stable oscillation signal may be shortened.

If a user apparatus that needs to activate the operations in a short time in response to the user instruction includes the phase locked loop device 10 and fails to activate the phase locked loop device 10 within a predetermined time, the user apparatus needs to keep the phase locked loop device 10 in an active state, so that power may be unnecessarily consumed even when there is no need to generate a clock signal by the phase locked loop device 10.

On the other hand, when the phase locked loop device 10 is activated within a predetermined time, the user apparatus is capable of activating the phase locked loop device 10 in response to a user instruction after maintaining the phase locked loop device 10 in an off state. Accordingly, the user apparatus does not consume power when a phase-locking operation is unnecessary, and thus may efficiently use power.

Accordingly, according to an embodiment of the disclosure, at least one of the frequency modulating circuit 11 and the phase locked loop circuit 13 may minimize power use in a sleep mode without performing an operation in response to a deactivation command signal and may be activated in response to the activation command signal. For example, the activation command signal may include at least one of the active and pre-active modes described with reference to FIG. 1, and the deactivation command signal may include at least one of idle, UFS-sleep, pre-sleep, UFS-PowerDown, and pre-PowerDown modes.

Figure 10:
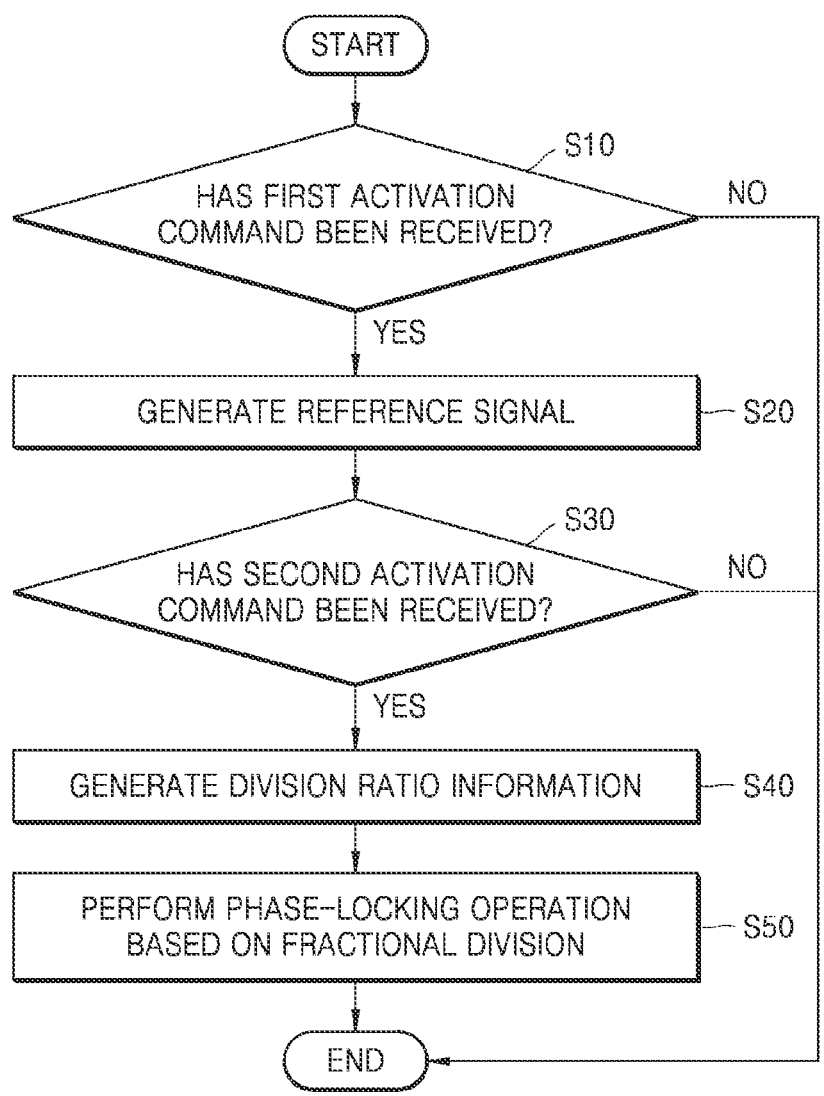
FIG. 10 is a flowchart illustrating a method of operating a phase locked loop device, according to an embodiment.

FIG. 10 is a flowchart illustrating a method of operating the phase locked loop device 10, according to an embodiment.

Referring to FIG. 10, the phase locked loop device 10 may determine whether to perform a phase-locking operation based on a fractional division based on an activation command. When performing the phase-locking operation, the phase locked loop device 10 may perform a phase-locking operation based on a high-frequency reference signal obtained by multiplying the frequency of the input signal by a predetermined ratio.

In step S10, the phase locked loop device 10 may determine whether a first activation command indicating whether to activate the frequency modulating circuit 11 has been received. When the first activation command has not been received, the phase locked loop device 10 may terminate the operation without performing the phase-locking operation.

In step S20, the phase locked loop device 10 may generate a high frequency reference signal in response to determining that the first activation command has been received. The high frequency reference signal may be a signal obtained by multiplying the frequency of the input signal by a predetermined ratio, and may be a reference signal from which pieces of noise near a target frequency are removed.

In step S30, the phase locked loop device 10 may determine whether a second activation command indicating whether to activate the phase locked loop circuit 13 has been received. When the second activation command has not been received, the phase locked loop device 10 may terminate the operation without performing the phase-locking operation.

In step S40, the phase locked loop device 10 may generate division ratio information in response to a case in which it is determined that the second activation command has been received. When the phase locked loop device 10 performs a phase-locking operation based on a fractional division, division ratio information indicating any one division ratio among a plurality of integer division ratios may be generated.

In step S50, the phase locked loop device 10 may perform a phase-locking operation based on a fractional division by receiving the high frequency reference signal generated in step S20 and division ratio information.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to embodiments thereof, it will be understood that various changes in form and details may be made therein without departing from the spirit and scope of the following claims.

What is claimed is:

1. A phase locked loop device comprising:
   a frequency modulating circuit configured to output a reference signal obtained by multiplying a frequency of an input signal by a predetermined ratio based on the input signal;
   a sigma-delta modulator configured to output division ratio information, on one of a plurality of division rates, at a number of times proportional to the frequency of the reference signal; and
   a phase locked loop circuit configured to determine whether to activate based on a command signal, and, when activated, perform a phase-locking operation based on a fractional division based on the reference signal and the division ratio information.

2. The phase locked loop device of claim 1, wherein the phase locked loop circuit includes a divider configured to provide a feedback signal, having a frequency obtained by dividing a frequency of an output signal by a division ratio, to an input terminal of the phase locked loop circuit.

3. The phase locked loop device of claim 2, wherein the phase locked loop circuit:
   includes a phase-frequency detector configured to detect a phase difference between the feedback signal and the reference signal and output a detection result, and
   generates the output signal that has a phase that is locked in response to the reference signal based on the detection result.

4. The phase locked loop device of claim 2, wherein the sigma-delta modulator outputs the division ratio information in response to a change in a logic state of the reference signal.

5. The phase locked loop device of claim 4, wherein the sigma-delta modulator determines whether to output the division ratio information by comparing a division ratio, among a plurality of division ratios, corresponding to the feedback signal with a target division ratio.

6. The phase locked loop device of claim 5, wherein the sigma-delta modulator:
   outputs first division ratio information corresponding to a division ratio lower than the target division ratio in response to a case where a division ratio corresponding to the feedback signal is higher than the target division ratio, and
   outputs second division ratio information corresponding to a division ratio higher than the target division ratio in response to a case where the division ratio corresponding to the feedback signal is lower than the target division ratio.

7. The phase locked loop device of claim 1, wherein the frequency modulating circuit comprises:
   a divider configured to output a feedback signal of which a logic state is changed in response to detecting an edge change of an output signal a certain number of times;
   a mode selection circuit for outputting a selection signal regarding whether to output a delay indication signal based on the feedback signal;
   a multiplexer (MUX) determining whether to output the delay indication signal based on the selection signal; and
   a delay circuit for delaying an output of the input signal in response to the delay indication signal being input.

8. The phase locked loop device of claim 1, wherein the frequency modulating circuit includes a pulse generator configured to lock a phase of an oscillator by applying a pulse signal to the oscillator generating the reference signal based on the input signal.

9. The phase locked loop device of claim 1, further comprising a controller configured to output a command signal to at least one of the frequency modulating circuit and the phase locked loop circuit based on an operation mode.

10. The phase locked loop device of claim 9, wherein the controller outputs an operation command signal to the frequency modulating circuit and outputs a deactivation command signal to the phase locked loop circuit, in response to the operation mode being an operation standby mode.

11. The phase locked loop device of claim 9, wherein the controller outputs an operation command signal to the frequency modulating circuit and blocks output of the command signal to the phase locked loop circuit, in response to the operation mode being an operation standby mode.

12. A method of operating a phase locked loop device, the method comprising:
   generating a reference signal obtained by multiplying a frequency of an input signal by a predetermined ratio based on the input signal;
   outputting division ratio information on one of a plurality of division rates at a number of times proportional to the frequency of the reference signal;
   receiving a command signal associated with whether to perform a phase-locking operation; and
   performing a phase-locking operation based on a fractional division based on the reference signal and the division ratio information in a case that the command signal instructs to perform a phase-locking operation.

13. The method of claim 12, wherein the performing of the phase-locking operation based on the fractional division includes providing a feedback signal, having a frequency obtained by dividing the frequency of an output signal by the division ratio information, to an input terminal of the phase locked loop circuit.

14. The method of claim 13, wherein the performing of the phase-locking operation based on the fractional division includes:
   detecting a phase difference between the feedback signal and the reference signal and outputting a detection result; and
   generating the output signal having a phase that is locked in response to the reference signal based on the detection result.

15. The method of claim 13, wherein the outputting of the division ratio information includes:
   outputting first division ratio information corresponding to a division ratio lower than a target division ratio in response to a case where the division ratio corresponding to the feedback signal is higher than the target division ratio, and
   outputting second division ratio information corresponding to a division ratio higher than the target division ratio in response to a case where the division ratio corresponding to the feedback signal is lower than the target division ratio.

16. The method of claim 12, wherein the generating of the reference signal includes:
   outputting a feedback signal in which a logic state is changed in response to detecting a change of an edge of an output signal a certain number of times;
   outputting a selection signal regarding whether to output a delay indication signal based on the feedback signal;
   determining whether to output the delay indication signal based on the selection signal; and
   delaying an output of the input signal in response to the delay indication signal being input.

17. The method of claim 12, wherein the generating of the reference signal includes fixing a phase of an oscillator by applying a pulse signal to the oscillator generating the reference signal based on the input signal.

18. The method of claim 12, further comprising:
   outputting a command signal instructing generation of the reference signal in response to a case in which an operation mode is an operation standby mode, and
   blocking a command signal instructing to perform the phase-locking operation.

19. A phase locked loop system comprising:
   a controller configured to generate a command signal indicating whether to perform a phase-locking operation based on an operation mode; and
   a phase locked loop device configured to:
      generate a reference signal obtained by multiplying a frequency of an input signal by a predetermined ratio based on the input signal,
      generate division ratio information on one of a plurality of division ratios at a number of times proportional to a frequency of the reference signal,
      receive the command signal, and
      perform a phase-locking operation based on a fractional division, which is based on the reference signal and the division ratio information, in a case that the command signal instructs to perform the phase-locking operation.

20. The phase locked loop system of claim 19, wherein the phase locked loop device includes:
   a divider configured to output a feedback signal of which a logic state is changed in response to detecting an edge change of an output signal a certain number of times;
   a mode selection circuit configured to output a selection signal regarding whether to output a delay indication signal based on the feedback signal;
   a multiplexer (MUX) configured to determine whether to output a delay indication signal based on the selection signal; and
   a delay circuit configured to delay an output of the input signal in response to the delay indication signal being input.

* * * * *